United States Patent [19]

Juskey, Jr. et al.

[11] Patent Number: 4,940,181

[45] Date of Patent: Jul. 10, 1990

[54] PAD GRID ARRAY FOR RECEIVING A SOLDER BUMPED CHIP CARRIER

[75] Inventors: Frank J. Juskey, Jr., Coral Springs; Barry M. Miles, Plantation; Anthony B. Suppelsa, Coral Springs, all of Fla.

[73] Assignee: Motorola, Inc., Schaumburg, Ill.

[21] Appl. No.: 333,670

[22] Filed: Apr. 6, 1989

[51] Int. Cl.$^5$ .......................... B23K 1/20; H05K 3/34
[52] U.S. Cl. .................. 228/180.2; 174/263; 361/406
[58] Field of Search ............ 228/180.2; 174/52.4, 174/68.5, 257, 262, 263, 264, 266; 361/406, 409

[56] References Cited

U.S. PATENT DOCUMENTS

| | | | |
|---|---|---|---|
| 3,335,489 | 8/1967 | Grant | 174/68.5 X |
| 3,379,937 | 4/1968 | Shepherd | 174/68.5 X |
| 3,436,818 | 4/1969 | Merrin et al. | 228/180.2 X |
| 3,552,004 | 1/1971 | Hagelbarger et al. | 174/68.5 X |
| 4,075,416 | 2/1978 | Kuttner et al. | 174/68.5 |
| 4,081,601 | 3/1978 | Dinella et al. | 174/68.5 |
| 4,617,730 | 10/1986 | Geldermans et al. | 29/853 |
| 4,642,160 | 2/1987 | Burgess | 29/852 |

Primary Examiner—Kenneth J. Ramsey
Attorney, Agent, or Firm—Thomas G. Berry; Pablo Meles

[57] ABSTRACT

A pad grid array comprises an array of cavities (12) formed in a circuit carrying substrate (10) that are metallized (18, 20, and 22) to provide electrical conductivity. The metallized cavities are preferably hemispherical in shape and approximately the size of the solder bumps (30) coupled to a solder bumped chip carrier (28) that will be mounted thereon. Flux (26) is applied to each of the metallized cavities before positioning the solder bumped chip (28) carrier over the pad grid array. Proper mounting can be detected by tactile sensing in either human or robotic assemblers when the solder bumps "drop" into the metallized cavities.

19 Claims, 2 Drawing Sheets

PAD GRID ARRAY FOR RECEIVING A SOLDER BUMPED CHIP CARRIER

TECHNICAL FIELD

This invention relates generally to mounting methods, and more particularly a method of mounting a solder bumped chip carrier to a circuit carrying substrate.

BACKGROUND ART

The use of solder bumps on a chip carrier (or other member) to facilitate mounting or attachment to a circuit carrying substrate is well known in the art. However, the closeness or density of the solder bumps and their corresponding solder pads has been limited using conventional technologies due to problems in preventing the solder pads when a flowing together and electrically shorting the solder pads when a reflow solder process is used. The inability to provide a high density solder bumps and solder pads has frustrated attempts to provide super miniaturized integrated circuit (IC) mounting techniques that are reliable in a mass production environment. Moreover, high density super miniaturized mounting techniques present significant alignment difficulties even when automated or robotic assembly methods are employed. Accordingly, a need exists in the art to provide a high density pad grid array suitable for receiving a solder bumped member that avoids the difficulties of prior mounting methods.

SUMMARY OF THE INVENTION

Accordingly, it is an object of the present invention to provide a high density pad grid array that overcomes the detriments of the prior art.

Briefly, according to the invention, a pad grid array comprises an array of cavities formed in a circuit carrying substrate (for example, a printed circuit (PC) board or substrate) that are metallized to provide electrical conductivity. The metallized cavities are preferably hemispherical in shape and approximately two-thirds (⅔) the size of the solder bumps coupled to a solder bumped chip carrier that will be mounted thereon.

In the preferred mounting method, flux is applied to each of the metallized cavities before positioning the solder bumped chip carrier over the pad grid array. The chip carier is located such that each solder bump is received by a repective metallized cavity. Proper mounting can be detected by tactile sensing in either human or robotic assemblers when the solder bumps "drop" into the metallized cavities. After locating the solder bump chip carrier, the surface tension acquired by seating the solder bumps in the cavities and the solder flux will hold the solder bump chip carrier in place until a reflow soldering process metallurgically alloys and electrically couples the solder bump chip carrier to the circuit carrying substrate.

DETAILED DESCRIPTION OF THE PREFERRED EMBODIMENT

Figure 1:
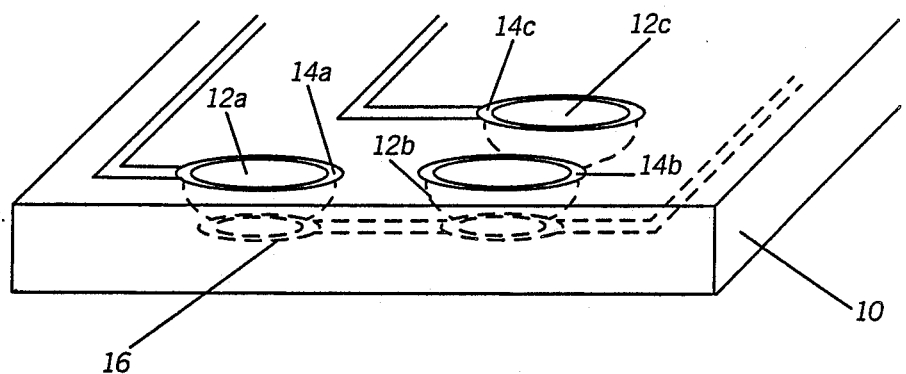
FIG. 1 is a perspective view of a portion of the pad grid array according to the present invention.

Referring to FIG. 1, a prepective view of a circuit carrying substrate 10 having a pad grid array in accordance with the present invention is shown. For clarity, three cavities 12a–12c of a pad grid array are shown. The skilled in the art will appreciate that the pad grid array of the present invention would extend in an actual implementation to include tens (or hundreds) of such cavities arranged in a square of other geometric pattern suitable to receive a solder bumped chip carrier or the like. Each of the cavities 12 is metallized so as to become electrically conductive. Electrical runners 14a–14c route electrical signals to and from their respective metallized cavities 12a–12c so as to allow electrical connection between the solder bump chip carrier and other circuitry contained elsewhere (not shown) on the substrate 10. In addition to the surface mounted runners 14, the present invention contemplates that buried conductors 16 may be used to contact the metallized cavities 12 about their midsection or bottom as shown in FIG. 1. Such practice enables a higher density (i.e. closer spacing) of the cavities 12 without unduly narrowing the spacing between the runners, which tends to promote electrical shorts and other unwanted connections. According to the invention, the preferred spacing (center-to-center) of the cavities is 50 (plus or minus 10) mils. Such a spacing is suitable to receive any of the advanced microcomputer or controller chips manufactured by Motorola, Inc., and others.

Figure 2:
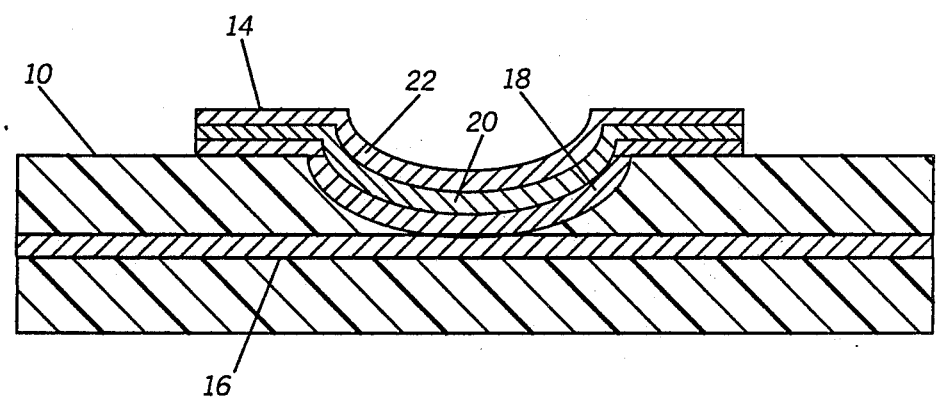
FIG. 2 is a cross sectional view of a metallized hemispherical cavity in accordance with the present invention.

FIG. 2 illustrates a cross sectional view of one of the metallized cavities 12. The circuit carrying substrate 10 has each cavity formed therein such as by drilling or other suitable processes known in the art. For example, in a molded substrate such as a molded printed circuit (PC) board, the cavity (or dimple) 12 could be formed by the tool used in the injection molding process. Preferably, each cavity is hemispherical in shape, although cavities having circular, oval, square, octagonal, or rectangular cross-sections may be used (but may be less convenient to form). The use of a hemispherical cavity shape facilitates soldering and reduces electrical shorting, which allows for increased pad density while maintaining reliability so as to be useful in a mass production environment. In any event, after a pad grid array of cavities are formed, they are metallized by applying a copper layer 18 so as to effectively coat the inner surface of the cavity. Preferably, the copper layer 18 comprises a first plating of electroless copper having a thickness of 0.05–0.1 mils, topped by a coating of electroplated copper having a thickness of 1.5–2 mils. For strength and protection, the copper layer 18 is covered with a nickel layer 20 having a preferred thickness of 0.15 mils. Finally, the surface of the cavity is coated by a gold layer 22 of approximately 0.04 mils to insure superior electrical connection.

As can be seen with reference to FIGS. 1 and 2, the runners 14a–14c preferable form an annular ring around each cavity 12a–12c. These annular ring (and associate linear runners) are preferably formed during the same operation in which the cavities are metalized. Accordingly, the runners 14 have substantially the same composition as the metal layers of the metalized cavities 12. The buried metallized copper runner 16 (which may be bare copper) may be incorporated using known techniques to provide electrical connection between subsurface portions of the now metallized cavity 12 and other circuity or electronic components.

According to the invention, the size of the cavity 12 is determined by the size of the solder bump to be received. According to the invention, the cavity 12 should be approximately two-thirds (⅔) the size of the solder bump. As an example, if the solder bumps are formed having a 34 mil (plus or minus 4 mils) diameter, the receiving cavities should be approximately 10 mils smaller in diameter than the typical solder bump diameter. The depth of the cavity 12 preferably resides in the range of 6-10 mils to insure effective metallization and sufficient tactile sensing when the solder bump member aligns and "drops" into the metallized cavites.

Figure 3:
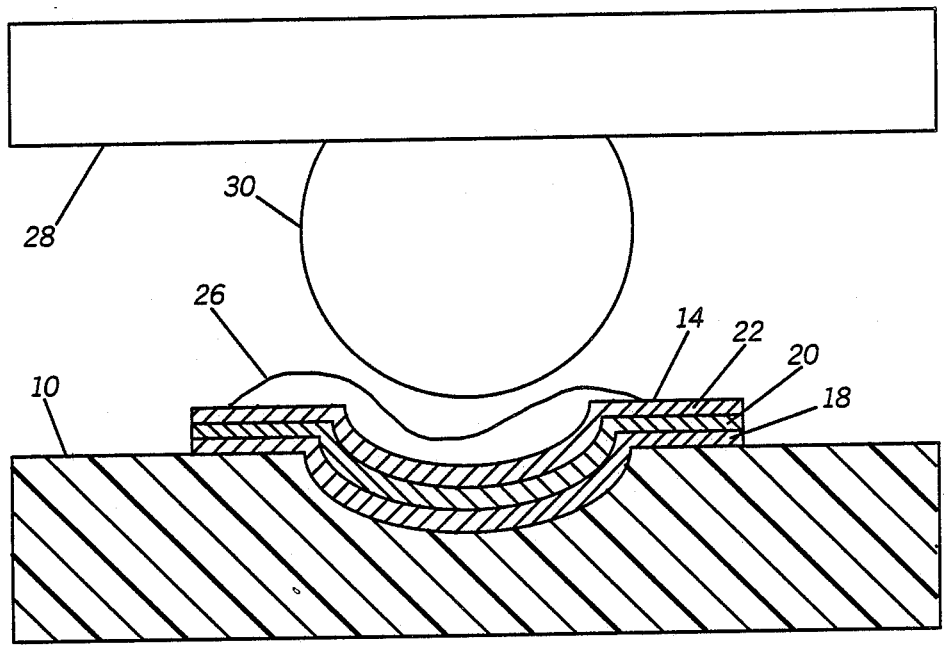
FIG. 3 is a cross sectional view of a solder bump chip carrier and a circuit carrying substrate according to the present invention prior to assembly.
Figure 4:
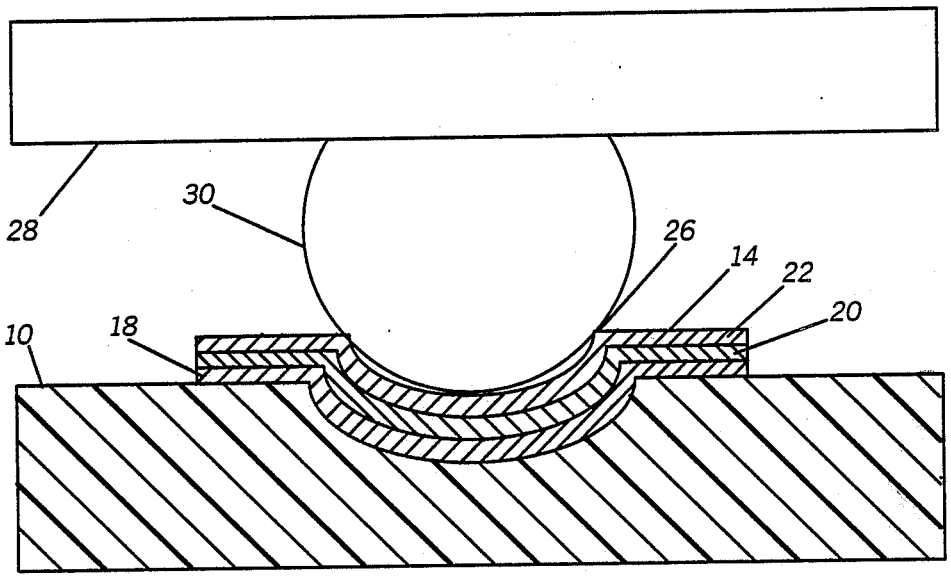
FIG. 4 is a cross sectional view of a solder bump chip carrier and a circuit carrying substrate after assembly and a reflow solder process.

The assembly process is best understood with reference to FIGS. 3 and 4. FIG. 3 illustrates a solder bumped chip carrier (or other member) 28 (solder bump 30 being shown in FIGS. 3 and 4 for clarity). Although alternate methods are known to form solder bumps on the chip carrier, the preferred method comprises that disclosed in U.S. patent application No. 07/292,988 by Altman et al., filed on January 3, 1989, and assigned to the same assignee as the present invention.

The preferred mounting method comprises positioning the solder bumped chip carrier 28 over the circuit carrying substrate 10 having an effective amount of solder flux 26 deposited in each of the metallized cavities. By using a slight sliding action, proper registration of the chip carrier 28 to the substrate 10 may be achieved and sensed by a human or robotic operator when the solder bump(s) 30 mate with the cavity(ies) 12. Once proper alignment has been obtained, the surface tension of the seated solder bump in the cavity and the surface tension of the solder flux 26 to the solder bump 30 will prevent misalignments during minor movement of transportation that may occur during a solder reflow process. The hemispherical shape of the cavity 12 provides an ideal wetting surface of the molten solder flux 26 in the reflow process. Moreover, the hemispherical cavity shape tends to force the solder flux to form a coating that conforms to the outer surface of the solder bump 30 and the inner surface of the metallized cavity 12. In this way, a high density pad grid array may be provided to receive a solder bumped chip carrier. The preferred cavity shape reduces the possibility of unwanted (i.e., shorting) electrical connections and is suitable for use in a mass production process. The tactile feedback provided by the mating of the solder bumped chip carrier into the metallized cavities facilitates robotic assembly and insures a positive registration that enhances the reliability of the finished product.

What is claimed is:

1. A method for attaching a solder bumped member to a substrate, comprising the steps of:
   (A) forming cavities in the substrate, said cavities being approximately two-third the size of the solder bumps:
   (B) applying metal to said cavities:
   (C) providing an effective amount of solder flux on said metallized cavities:
   (D) positioning the solder bumped member so as to align the solder bumps within said metallized cavities;
   (E) heating said solder flux so as to electrically couple said metallized cavities to a respective solder bump.

2. The method of claim 1, wherein step (A) comprises the steps of:
   (A1) forming cavities in a substrate, said cavities being approximately two-third the size of the solder bumps;
   (A2) applying metal to said cavities.

3. The method of claim 1, wherein step (A) comprises: forming said cavities in said substrate via drilling.

4. The method of claim 1, wherein step (A) comprises: forming said cavities in said substrate via molding.

5. The method of claim 1, wherein step (B) consists of the steps of:
   (B1) applying a copper layer to said cavities;
   (B2) applying a nickel layer over said copper layer;
   (B3) applying a gold layer over said nickel layer.

6. The method of claim 1, which includes the step of:
   (C) applying metal to said substrate to form electrical runners on said substrate.

7. The method of claim 1, wherein step (D) comprises: positioning the solder bumped member via an automated assembler so as to align the solder bumps within said metallized cavities.

8. The method of claim 1, wherein step (D) comprises: positioning the solder bumped member via a robotic assembler so as to align the solder bumps within said metallized cavities.

9. A method for providing a substate to receive a solder bump member, comprising the steps of:
   (A) forming substantially hemispherical cavities ina substrate, said cavities being approximately two-thirds the size of the solder bumps;
   (B) applying metal to said cavities.

10. The method of claim 9, wherein step (A) comprises: forming said cavities in said substrate via drilling.

11. The method of claim 9, wherein step (A) comprises: forming said cavities in said substrate via molding.

12. The method of claim 9, wherein step (B) comprises the steps of:
   (B1) applying a copper layer to said cavities;
   (B2) applying a nickel layer over said copper layer;
   (B3) applying a gold layer over said nickel layer.

13. The method of claim 9, which includes the step of:
   (C) applying metal to said substrate to form electrical runners on said substrate.

14. A circuit carrying substate for receiving a solder bumped member, comprising:
   a substrate having a plurality of metallized cavities formed therein, each metallized cavity constructed and arranged in a substantially hemispherical shape so as to receive the solder bumped member.

15. The circuit carrying substrate of claim 14, wherein said plurality of metallized cavities are hemispherical.

16. The circuit carrying substrate of claim 14, wherein said plurality of metallized cavities are constructed and arranged to couple with electrical runners formed within the substrate.

17. The circuit carrying substrate of claim 14, wherein said plurality of metallized cavities are two-thirds the size of the solder bumped member.

18. The circuit carrying substrate of claim 14, wherein said plurality of metallized cavities are arranged to lie in a circle.

19. The circuit carrying substrate of claim 14, wherein said plurality of metallized cavities are arranged to form a octagon.

* * * * *